US007601573B2

(12) United States Patent
Nakagawa

(10) Patent No.: US 7,601,573 B2
(45) Date of Patent: Oct. 13, 2009

(54) METHOD FOR PRODUCING NITRIDE SEMICONDUCTOR DEVICE

(75) Inventor: Atsushi Nakagawa, Kamifukuoka (JP)

(73) Assignee: New Japan Radio Co., Ltd., Tokyo-to (JP)

( * ) Notice: Subject to any disclaimer, the term of this patent is extended or adjusted under 35 U.S.C. 154(b) by 189 days.

(21) Appl. No.: 11/862,565

(22) Filed: Sep. 27, 2007

(65) Prior Publication Data

US 2008/0026514 A1  Jan. 31, 2008

Related U.S. Application Data

(62) Division of application No. 10/996,440, filed on Nov. 26, 2004, now Pat. No. 7,304,330.

(30) Foreign Application Priority Data

Nov. 28, 2003  (JP)  ............... 2003-436146
Apr. 21, 2004  (JP)  ............... 2004-125323

(51) Int. Cl.
  *H01L 21/338*  (2006.01)
(52) U.S. Cl.  ............... 438/172; 438/167; 257/E21.086
(58) Field of Classification Search  ............... 438/167, 438/172; 257/192, 200, 472, E21.086
  See application file for complete search history.

(56) References Cited

U.S. PATENT DOCUMENTS

| 6,376,860 B1 * | 4/2002 | Mitanaga et al. ............... 257/57 |
| 6,492,669 B2 | 12/2002 | Nakayama et al. |
| 2001/0035530 A1 * | 11/2001 | Udagawa ............... 257/79 |
| 2003/0064538 A1 * | 4/2003 | Fujimoto ............... 438/48 |
| 2003/0082860 A1 | 5/2003 | Yoshida et al. |
| 2004/0155260 A1 | 8/2004 | Kuzmik |
| 2005/0285141 A1 | 12/2005 | Piner et al. |

FOREIGN PATENT DOCUMENTS

JP  10-335637  12/1998

OTHER PUBLICATIONS

Y. Ohno, et al.; "International Conference on Nitride Semiconductor, Nara, 2003, Tu-P2. 067" (p. 375).
Y. Liu, et al.; Growth and characterization of high-quality quaternary AlInGaN epilayers on sapphire; *Journal of Crystal Growth* 259 (2003), pp. 151-157.
Lee, et al.; "Characterization of GaN Schottky barrier photodetectors with a low-temperature GaN cap layer"; Journal of Applied Physics., vol. 94, No. 3, Aug. 1, 2003.

* cited by examiner

*Primary Examiner*—Ngan Ngo
(74) *Attorney, Agent, or Firm*—Antonelli, Terry, Stout & Kraus, LLP.

(57) ABSTRACT

A nitride semiconductor device, which includes a III-V Group nitride semiconductor layer being composed of a III Group element consisting of at least one of a group containing of gallium, aluminum, boron and indium and V Group element consisting of at least nitrogen among a group consisting of nitrogen, phosphorus and arsenic, including a first nitride semiconductor layer including the III-V Group nitride semiconductor layer being deposited on a substrate, a second nitride semiconductor layer including the III-V Group nitride semiconductor layer being deposited on the first nitride semiconductor and not containing aluminum and a control electrode making Schottky contact with the second nitride semiconductor layer wherein the second nitride semiconductor layer includes a film whose film forming temperature is lower than the first nitride semiconductor layer.

10 Claims, 6 Drawing Sheets

METHOD FOR PRODUCING NITRIDE SEMICONDUCTOR DEVICE

REFERENCE TO RELATED APPLICATION

This application is a divisional of U.S. application Ser. No. 10/996,440 filed Nov. 26, 2004 now U.S. Pat. No. 7,304,330.

BACKGROUND OF THE INVENTION

The present invention relates to a nitride semiconductor device using nitride semiconductors for active layers and a process for producing thereof, and specifically, relates to a nitride semiconductor device which is making Schottky contact with a semiconductor device such as a High Electron Mobility Transistor (HEMT) and a Field Effect Transistor (FET) and a process for producing thereof.

FIG. 10 shows the cross-section view of a semiconductor device comprising a conventional III-V Group nitride semiconductor. The semiconductor device shown in FIG. 10 shows a so-called HEMT structure and it is a structure in which a buffer layer 102 consisting of gallium nitride (GaN), a channel layer 103 consisting of gallium nitride, a charge supply layer 104 consisting of n-type aluminum gallium nitride (AlGaN) and a Schottky layer 105 consisting of non-doped aluminum gallium nitride were deposited in order on a substrate 101 consisting of a sapphire substrate. Two dimensional electron gas having extremely high electron mobility consisting of a potential well is formed nearby a hetero junction interface consisting of the channel layer 103 and the charge supply layer 104. The semiconductor device having such structure controls carrier density of two dimensional electron gas which flows between a source electrode 107a and a drain electrode 107b by controlling voltage which is applied to a gate electrode 106 (control electrode) making Schottky contact with a Schottky layer 105.

Various structures which are disclosed in, for example, Japanese Unexamined Patent Publication No. 335637/1998 are proposed for this kind of semiconductor device, in addition to the above-mentioned structure.

SUMMARY OF THE INVENTION

However, the breakdown voltage of a conventional nitride semiconductor device is affected by the Schottky property which is formed by bringing a gate metal in contact with the nitride semiconductor layer. High gate leakage current is observed for the Schottky property of the gate metal which is generally formed on a nitride semiconductor layer, for example, an aluminum gallium nitride (AlGaN) layer and a gallium nitride (GaN) layer. There has been a problem that this becomes a trigger for impact ionization, lowers the OFF-state breakdown voltage (the drain breakdown voltage at a condition in which FET is OFF) which is the important parameter of a nitride semiconductor device being a high output power, smaller than a value expected, and the characteristic of the high breakdown voltage of a wide band gap material cannot be adequately realized. On the other hand, there have been problems that surface potential is fluctuated and the frequency dispersion of current-voltage characteristic is also generated in a semiconductor device in which the gate electrode was formed on the nitride semiconductor layer such as an aluminum gallium nitride (AlGaN) layer and a gallium nitride (GaN) layer, by electrons trapped in the surface states of the nitride semiconductor layer. The purpose of the present invention is to provide a nitride semiconductor device which reduces greatly the leakage current in the Schottky property of the control electrode (gate electrode) which is formed on the nitride semiconductor device, realizes the high breakdown voltage by suppressing the impact ionization in the nitride semiconductor device and can suppress the frequency dispersion and a process for producing thereof.

In order to attain the above-mentioned purpose, the present invention in a first aspect is a nitride semiconductor device, which includes a III-V Group nitride semiconductor layer composed of a III Group element consisting of at least one of a group containing of gallium, aluminum, boron and indium and V Group element consisting of at least nitrogen among a group consisting of nitrogen, phosphorus and arsenic, including a first nitride semiconductor layer including the III-V Group nitride semiconductor layer being deposited on a substrate, a second nitride semiconductor layer including the III-V Group nitride semiconductor layer being deposited on the first nitride semiconductor and not containing aluminum and a control electrode making Schottky contact with the second nitride semiconductor layer wherein the second nitride semiconductor layer includes a film whose film forming temperature is lower than the first nitride semiconductor layer.

The invention, in a second aspect is a nitride semiconductor device, which includes a III-V Group nitride semiconductor layer being composed of a III Group element consisting of at least one of a group containing of gallium, aluminum, boron and indium and V Group element consisting of at least nitrogen among a group consisting of nitrogen, phosphorus and arsenic including a first nitride semiconductor layer including the III-V Group nitride semiconductor layer being deposited on a substrate, a second nitride semiconductor layer including the III-V Group nitride semiconductor layer being deposited on the first nitride semiconductor and not containing aluminum and a control electrode making Schottky contact with the second nitride semiconductor layer, wherein the second nitride semiconductor layer comprises crystallinity with minute grains.

The invention is further a nitride semiconductor device of either of the aforementioned aspects, wherein the first nitride semiconductor layer includes the III-V Group nitride semiconductor layer containing aluminum.

The nitride semiconductor device of the invention, as an additional feature, includes a third nitride semiconductor layer between the substrate and the first nitride semiconductor layer, wherein the third nitride semiconductor layer includes the III-V Group nitride semiconductor layer having a smaller energy band gap than that of the first nitride semiconductor.

The nitride semiconductor device of the invention including the control electrode making Schottky contact with the second nitride semiconductor layer further includes a source electrode and drain electrode making ohmic contact with the first nitride semiconductor layer, wherein electric current, which flows a channel including the first nitride semiconductor layer or a channel being formed between third nitride semiconductor layer and first nitride semiconductor layer, is controlled through voltage applied to the control electrode.

In this form of the invention, the nitride semiconductor device having the first nitride semiconductor layer includes non-doped or n-type nitride semiconductor layer, and a p-type nitride semiconductor region is provided at the second nitride semiconductor layer located between the control electrode and the drain electrode.

The invention is also a method for producing a nitride semiconductor device, which includes a III-V Group nitride semiconductor layer being composed of a III Group element consisting of at least one of a group containing of gallium, aluminum, boron and indium and V Group element consisting of at least nitrogen among a group consisting of nitrogen, phosphorus and arsenic, the method including steps of forming a first nitride semiconductor device including the III-V Group nitride semiconductor layer on a substrate, forming a second nitride semiconductor device including the III-V Group nitride semiconductor device and crystallinity with minute grains not containing aluminum at a lower temperature than a film forming temperature on the first nitride semiconductor layer and forming a control electrode on the second nitride semiconductor layer.

The invention further comprises a method for producing a nitride semiconductor device, which includes a III-V Group nitride semiconductor layer being composed of a III Group element consisting of at least one of a group containing of gallium, aluminum, boron and indium and V Group element consisting of at least nitrogen among a group consisting of nitrogen, phosphorus and arsenic, the method including steps of forming a first nitride semiconductor device including the III-V Group nitride semiconductor layer, and containing aluminum on a substrate, forming a second nitride semiconductor device including the III-V Group nitride semiconductor device and crystallinity with minute grains not containing aluminum at a lower temperature than a film forming temperature on the first nitride semiconductor layer and forming a control electrode on the second nitride semiconductor layer.

The disclosed methods include as additional steps forming a third nitride semiconductor layer, which includes the III-V Group nitride semiconductor layer having a smaller energy band gap than that of the first nitride semiconductor layer, on the substrate and forming the first nitride semiconductor layer on the third nitride semiconductor layer.

Further, the methods include steps of removing the second nitride semiconductor layer, forming an n-type nitride semiconductor region on the first nitride semiconductor layer being exposed or a part of the second nitride semiconductor layer, forming a source electrode or drain electrode making ohmic contact with the first nitride semiconductor layer on the n-type nitride semiconductor region and forming the control electrode making Schottky contact with the second nitride semiconductor layer.

The invention is a method for producing a nitride semiconductor device as described including steps of forming the control electrode on the second nitride semiconductor layer being deposited on the first nitride semiconductor layer including non-doped or n-type nitride semiconductor layer and forming a p-type nitride semiconductor region at the second nitride semiconductor layer located between the control electrode and the drain electrode.

The invention is also a method for producing a nitride semiconductor device as indicated, comprising an annealing process for steps of forming the n-type nitride semiconductor region or forming the p-type nitride semiconductor region wherein the annealing process is carried out within a temperature range at which the sheet resistance of the second nitride semiconductor layer is not lowered.

The nitride semiconductor device according to the invention of the present application is a structure in which the control electrode is making contact with a nitride semiconductor layer not containing at least aluminum, and leakage current can be reduced by making the nitride semiconductor layer be the crystallinity with minute grains with high insulating property. When the control electrode of the present invention was set as the gate electrode such as FET or HEMT, gate leakage current is reduced. Further, the high breakdown voltage can be realized by suppressing the impact ionization at the channel. Since the structure in which the nitride semiconductor layer consisting of the crystallinity with minute grains with high insulating property is provided between the gate electrode and the drain electrode is made, electrons which are trapped in the surface states between the gate electrode and the drain electrode are suppressed or current collapse phenomenon is suppressed by reduction of the surface states density and high frequency characteristics are also improved.

Further, since the screening effect for carriers trapped in the surface states is revealed by forming the p-type nitride semiconductor region between the gate electrode and the drain electrode, the frequency dispersion of current-voltage characteristic caused by fluctuation of surface potential can be suppressed.

Further, since the process for producing the nitride semiconductor device according to the present invention can form a nitride semiconductor device with a desired structure by control of the temperature of epitaxial growth by the production steps of a usual nitride semiconductor device and only by control of the ion implantation method, the controllability of the production steps is superior and the nitride semiconductor device superior in characteristics can be produced in good yield.

DETAILED DESCRIPTION

Respective Embodiments with respect to the nitride semiconductor device and the production process of the nitride semiconductor device of the present invention are illustrated below in order.

EMBODIMENT 1

Figure 1:
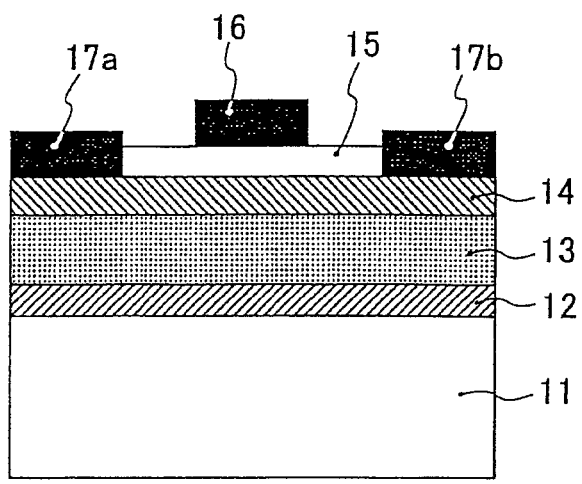
FIG. 1 is a cross-section view of the nitride semiconductor device which is the first Embodiment of the present invention.

Firstly, the nitride semiconductor device of the present invention is specifically illustrated referring to HEMT which is the III-V Group nitride semiconductor device as an example. FIG. 1 is the cross-section view of HEMT which is the III-V Group nitride semiconductor device which is the first Embodiment of the present invention. As shown in FIG.

1, a buffer layer 12 consisting of aluminum nitride (AlN) with a thickness of about 100 nm, a channel layer 13 consisting of non-doped gallium nitride (GaN) with a thickness of 2 μm having a smaller energy band gap than that of a charge supply layer described later, a charge supply layer 14 consisting of n-type aluminum gallium nitride (AlGaN) with a thickness of 15 nm which forms the two dimensional electron gas being carriers at an interface with the channel layer 13 and a Schottky layer 15 consisting of non-doped gallium nitride (GaN) with a thickness of 10 nm having the crystallinity with minute grains were formed by deposition on a substrate 11 consisting of silicon carbide (SiC). The gate electrode 16 consisting of a laminate of nickel (Ni)/gold (Au) and the like is formed on the Schottky layer 15 and the Schottky contact is made on the Schottky layer 15. Further, the portion of the Schottky layer 15 is removed and a source electrode 17a and a drain electrode 17b consisting of titanium (Ti)/aluminum (Al) which are making ohmic contact with the charge supply layer 14 are formed.

Figure 2:
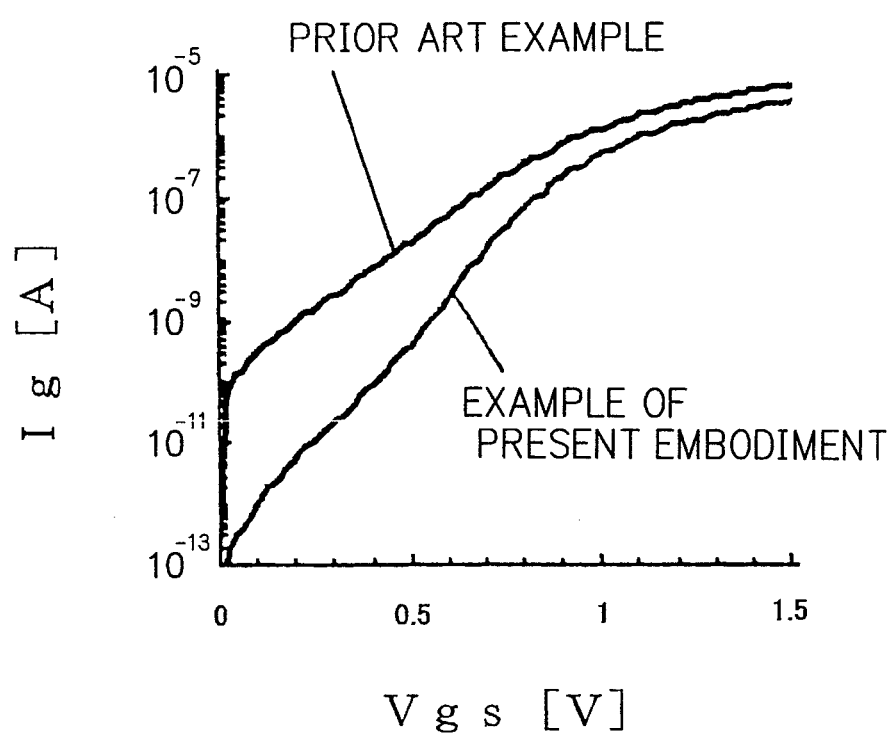
FIG. 2 is a view showing the current-voltage characteristic which illustrates the effect of the present invention.

A semiconductor layer with high insulating property is formed on the Schottky layer 15 consisting of the crystallinity with minute grains by forming a film at a lower temperature by about 500° C. than the film forming temperature of the charge supply layer 14 by an MOCVD (metalorganic chemical vapor deposition) method, an MBE (molecular beam epitaxy) method and the like. Specifically, the sheet resistance is a high resistance of $10^9$ Ω/□ or more. FIG. 2 shows the current-voltage characteristic between the gate-source electrodes. In the graph, the horizontal axis shows gate-source voltage Vgs (V) and the vertical axis shows gate electric current Ig (A). For comparison, the current-voltage characteristic is shown when a gate electrode having the same structure was formed on the semiconductor layer consisting of non doped aluminum gallium nitride (AlGaN) in which the Schottky layer 15 was formed under the same temperature and a film forming condition as the charge supply layer 14. When both are compared, it is grasped that the gate current (gate leakage current) is reduced by two orders of magnitude or more because the nitride semiconductor device related to the present Embodiment is superior in insulation property. Impact ionization at the channel can be suppressed in accordance with the reduction of the leakage electric current, and as a result, OFF-state breakdown voltage was improved from a conventional 100 V to 170 V. The OFF-state breakdown voltage of the nitride semiconductor HEMT is not derived from thermal runaway but is caused by the impact ionization, and it is reported that it is greatly affected by tunnel current which flows from the Schottky electrode to the channel (International Conference on Nitride Semiconductor, Nara, 2003, Tu-P2. 067).

Figure 3:
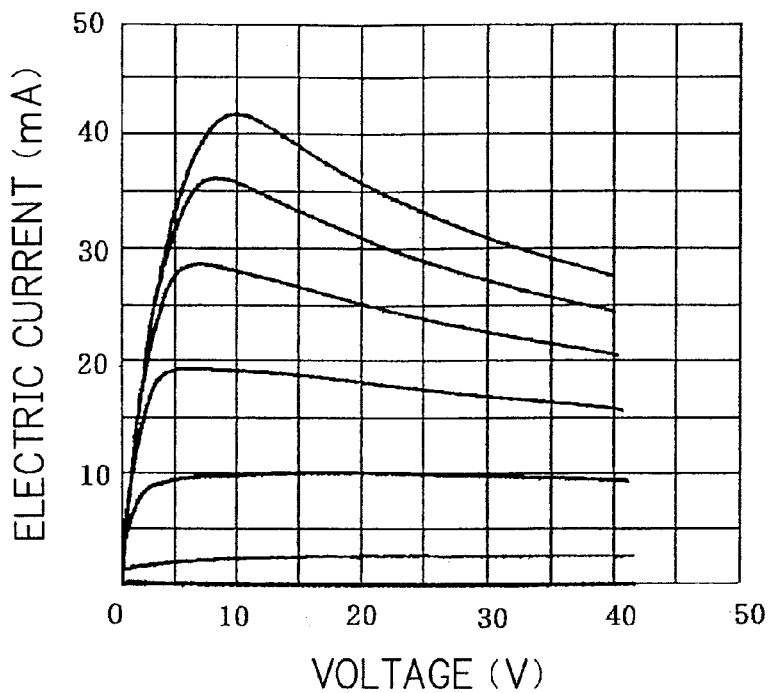
FIG. 3 is a view showing the drain current-voltage characteristic which illustrates the effect of the present invention.
Figure 4:
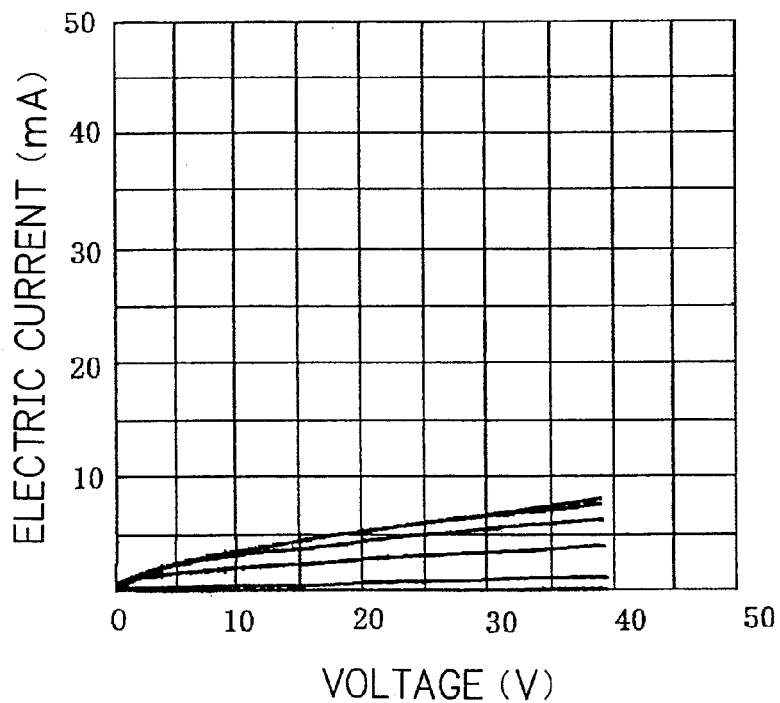
FIG. 4 is a view showing the drain current-voltage characteristic of a conventional nitride semiconductor device.

FIGS. 3 and 4 show respectively the drain current-voltage characteristics of HEMT which are the III-V Group nitride semiconductor devices of the present invention and the above-mentioned conventional structure. The sweep voltage of the drain is 0 V to 40 V, and the gate voltage is varied by a step of 1V from −4 V to +2 V. The measurement cycle is 10 ms, the gate voltage is applied at a pulse width of 300 μsec., and the drain voltage is raised stepwise from 0 V to 40 V. It could be confirmed according to the comparison of FIG. 3 with FIG. 4 that the nitride semiconductor device of the present invention suppresses greatly the current collapse in comparison with a conventional structure.

EMBODIMENT 2

Figure 5:
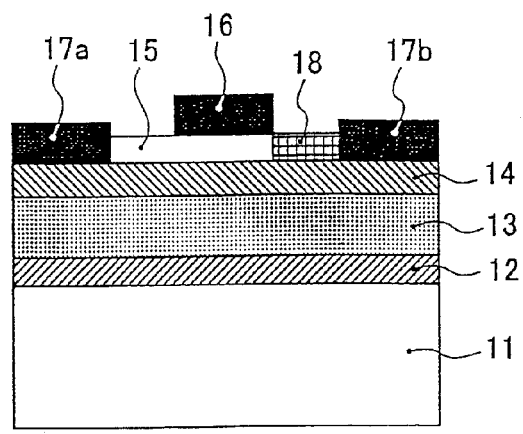
FIG. 5 is a cross-section view of the nitride semiconductor device which is the second Embodiment of the present invention.

Then, the second Embodiment is illustrated. FIG. 5 is the cross-section view of HEMT which is the III-V Group nitride semiconductor device which is the second Embodiment of the present invention. In like manner as the first Embodiment as shown in FIG. 1, a buffer layer 12 consisting of aluminum nitride (AlN) with a thickness of about 100 nm, a channel layer 13 consisting of non-doped gallium nitride (GaN) with a thickness of 2 μm, a charge supply layer 14 consisting of n-type aluminum gallium nitride (AlGaN) with a thickness of 15 nm which forms the two dimensional electron gas being careers at an interface with the channel layer 13 and a Schottky layer 15 consisting of non-doped gallium nitride (GaN) with a thickness of 10 nm having the crystallinity with minute grains are formed by deposition on a substrate 11 consisting of silicon carbide (SiC). The gate electrode 16 consisting of a laminate of nickel (Ni)/gold (Au) and the like is formed on the Schottky layer 15 and the Schottky contact is made with the Schottky layer 15. Further, the portion of the Schottky layer 15 is removed and a source electrode 17a and a drain electrode 17b consisting of titanium (Ti)/aluminum (Al) which are making ohmic contact with the charge supply layer 14 are formed. In the present Embodiment, a p-type semiconductor region 18 which reaches at the charge supply layer 14 is formed between the gate electrode 16 and the drain electrode 17b, differing from the first Embodiment. The p-type semiconductor region 18 was formed by implanting p-type impurity ion in the portion of the Schottky layer 15.

Since influence to the channel which is caused by the fluctuation of surface potential which is considered to be generated by electrons which were trapped in the surface states existing on the surface of the Schottky layer 15 can be removed by providing the p-type semiconductor region 18, the frequency dispersion of current-voltage characteristic can be suppressed at the similar level as the drain current-voltage characteristic which was shown in FIG. 3.

EMBODIMENT 3

Figure 6:
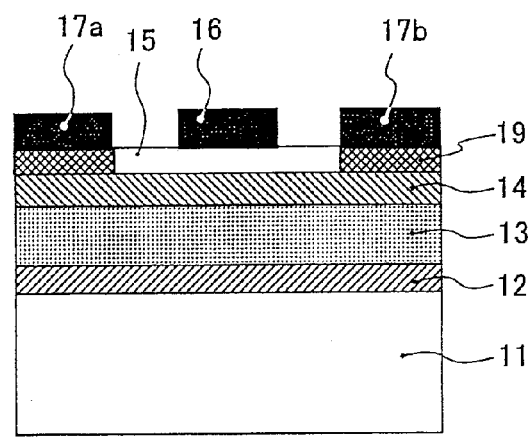
FIG. 6 is a cross-section view of the nitride semiconductor device which is the third Embodiment of the present invention.

FIG. 6 is the cross-section view of HEMT which is the III-V Group nitride semiconductor device which is the third Embodiment of the present invention. In like manner as the first Embodiment as shown in FIG. 1, a buffer layer 12 consisting of aluminum nitride (AlN) with a thickness of about 100 nm, a channel layer 13 consisting of non-doped gallium nitride (GaN) with a thickness of 2 μm, a charge supply layer 14 consisting of n-type aluminum gallium nitride (AlGaN) with a thickness of 15 nm which forms the two dimensional electron gas being carriers at an interface with the channel layer 13 and a Schottky layer 15 consisting of non-doped gallium nitride (GaN) with a thickness of 10 nm having the crystallinity with minute grains are formed by deposition on a substrate 11 consisting of silicon carbide (SiC). The gate electrode 16 consisting of a laminate of nickel (Ni)/gold (Au) and the like is formed on the Schottky layer 15 and the Schottky contact is made with the Schottky layer 15. In the present Embodiment, a n-type semiconductor region 19 which reaches at the charge supply layer 14 is formed at the portion of the Schottky layer 15, differing from the first Embodiment. The n-type semiconductor region 19 was formed by implanting n-type impurity ion into the portion of the Schottky layer 15. Ohmic contact with low contact resistance can be made by forming a source electrode 17a and a drain electrode 17b consisting of titanium (Ti) and aluminum (Al) which is making ohmic contact with the n-type semiconductor region 19.

Since the source electrode 17a and the drain electrode 17b can be formed by providing the n-type semiconductor region 19 thus without removing the portion of the Schottky layer 15, it becomes a planar structure, and the yield of the production steps and reliability are improved.

EMBODIMENT 4

Figure 7:
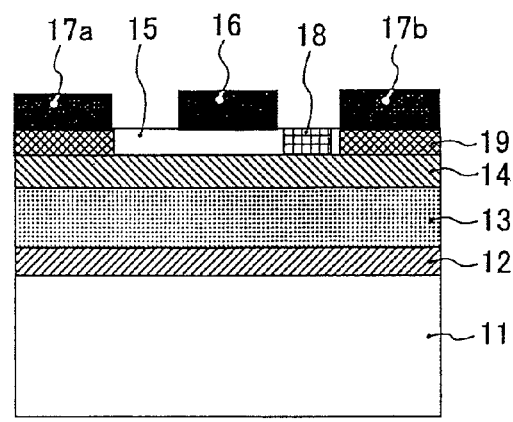
FIG. 7 is a cross-section view of the nitride semiconductor device which is the fourth Embodiment of the present invention.

FIG. 7 shows the cross-section view of HEMT which is the III-V Group nitride semiconductor device which is the fourth Embodiment of the present invention. In like manner as the first Embodiment as shown in FIG. 1, a buffer layer 12 consisting of aluminum nitride (AlN) with a thickness of about 100 nm, a channel layer 13 consisting of non-doped gallium nitride (GaN) with a thickness of 2 μm, a charge supply layer 14 consisting of n-type aluminum gallium nitride (AlGaN) with a thickness of 15 nm which forms the two dimensional electron gas being carriers at an interface with the channel layer 13 and a Schottky layer 15 consisting of non-doped gallium nitride (GaN) with a thickness of 10 nm having the crystallinity with minute grains are formed by deposition on a substrate 11 consisting of silicon carbide (SiC). The gate electrode 16 consisting of a laminate of nickel (Ni)/gold (Au) and the like is formed on the Schottky layer 15 and the Schottky contact is made with the Schottky layer 15. Further, in like manner as the third Embodiment, a n-type semiconductor region 19 which reaches at the charge supply layer 14 is formed at the portion of the Schottky layer 15. The n-type semiconductor region 19 was formed by implanting n-type impurity ion into the portion of the Schottky layer 15. A source electrode 17a and a drain electrode 17b consisting of titanium (Ti) and aluminum (Al) which are making ohmic contact are formed on the n-type semiconductor region 19. Further, the p-type semiconductor region 18 which reaches at the charge supply layer 14 is formed between the gate electrode 16 and the drain electrode 17b. The p-type semiconductor region 18 was formed by implanting impurity ion into the portion of the Schottky layer 15.

Since the source electrode 17a and the drain electrode 17b can be formed by providing the n-type semiconductor region 19 thus without removing the portion of the Schottky layer 15, it becomes a planar structure, and the yield of the production steps and reliability are improved. Since influence to the channel which is caused by the fluctuation of surface potential which is considered to be generated by electrons which were trapped in the surface states existing on the surface of the Schottky layer 15 can be removed by providing the p-type semiconductor region 18, the frequency dispersion of current-voltage characteristic can be suppressed at the similar level as the drain current-voltage characteristic which was shown in FIG. 3.

EMBODIMENT 5

Then, the nitride semiconductor device of the second invention of the present application is illustrated referring to HEMT which is the III-V Group nitride semiconductor device having the structure which was shown in the above-mentioned Embodiments 1 to 4, as an example.

Figure 8A:
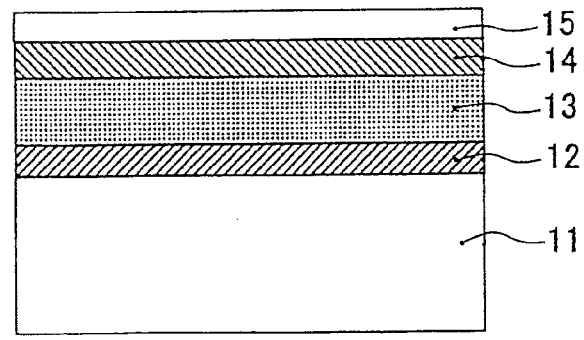
FIGS. 8(a)-8(c) are respective illustrations of the production process of the nitride semiconductor device which is the first Embodiment of the present invention.

Firstly, the production process of HEMT which is shown in the first Embodiment is illustrated. As shown in FIG. 8, a buffer layer 12 consisting of aluminum nitride (AlN) with a thickness of about 100 nm is grown on a substrate 11 consisting of silicon carbide (SiC) by an MOCVD method, and then a channel layer 13 consisting of non-doped gallium nitride (GaN) with a thickness of 2 μm and a charge supply layer 14 consisting of n-type aluminum gallium nitride (AlGaN) with a thickness of 15 nm which forms the two dimensional electron gas being carriers at an interface with the channel layer 13 are formed by deposition at a substrate temperature of 1080° C. in order. Then, the substrate temperature is set at 550° C. and a Schottky layer 15 consisting of non-doped gallium nitride (GaN) with a thickness of 10 nm is grown. The Schottky layer 15 becomes the crystallinity with minute grains by being grown at a low substrate temperature and becomes a layer superior in insulation property (FIG. 8a).

Figure 8B:
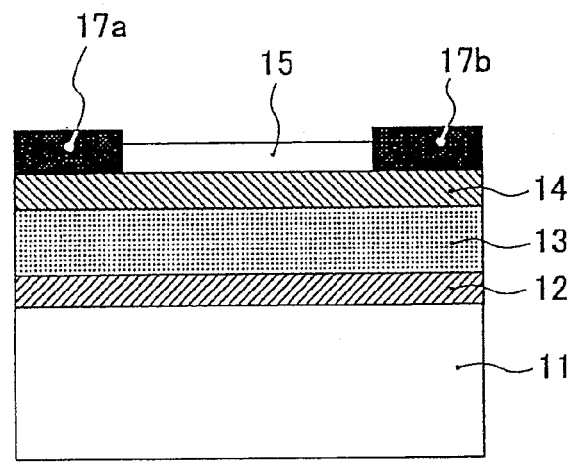

Then, the portion of the Schottky layer 15 is removed by a usual lithography and an etching method to expose the charge supply layer 14. Hereat, AlGaN and GaN can be selectively etched, and the Schottky layer 15 can be removed in good controllability. The source electrode 17a and the drain electrode 17b which are making ohmic contact with the charge supply layer 14 are formed by depositing a titanium (Ti) film with a thickness of about 20 nm and an aluminum (Al) film with a thickness of about 200 nm on the charge supply layer 14 which was exposed, by an electron beam deposition method and the like (FIG. 8b).

Figure 8C:
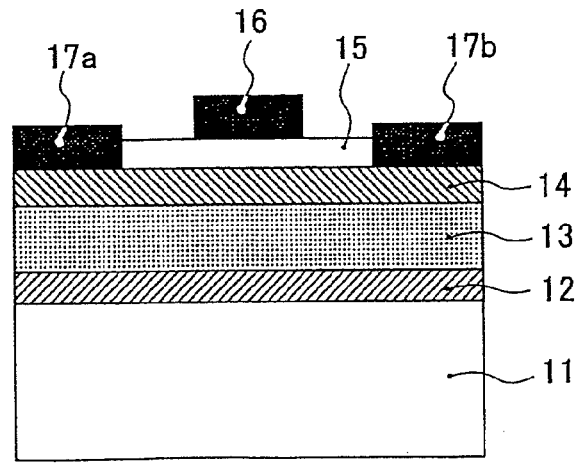

Then, the gate electrode 16 which is making Schottky contact on the Schottky layer 15 is formed by depositing the laminate of a thickness of 20 nm of nickel (Ni)/a thickness of 300 nm of gold (Au) and the like and patterning on the Schottky layer 15 by a usual lithography and a lift-off method (FIG. 8c). HEMT is completed below according to the usual production steps of a semiconductor device.

In the present Embodiment, since it is formed only by setting the growth temperature (film forming temperature) at a lower temperature (550° C.) than the growth temperature (1080° C.) of epitaxial layers such as the channel layer 13 and the charge supply layer 14 as a method of forming the Schottky layer 15 with the crystallinity with minute grains superior in insulation property, controllability is good. Further, since the production process of the present invention is subjected to the usual production steps of a semiconductor device, controllability is extremely good and the production can be carried out in good yield.

EMBODIMENT 6

Then, the production process of HEMT which is shown in the second Embodiment is illustrated. As shown in FIG. 8 in like manner as the fifth Embodiment, a buffer layer 12 consisting of aluminum nitride (AlN) with a thickness of about 100 nm is grown on a substrate 11 consisting of silicon carbide (SiC) by an MOCVD method, and then a channel layer 13 consisting of non-doped gallium nitride (GaN) with a thickness of 2 μm and a charge supply layer 14 consisting of n-type aluminum gallium nitride (AlGaN) with a thickness of 15 nm which forms the two dimensional electron gas being carriers at an interface with the channel layer 13 are formed by deposition at a substrate temperature of 1080° C. in order. Then, the substrate temperature is set at 550° C. and a Schottky layer 15 consisting of non-doped gallium nitride (GaN) with a thickness of 10 nm is grown. The Schottky layer 15 becomes the crystallinity with minute grains by being thus grown at a low substrate temperature and becomes a layer superior in insulation property (FIG. 8a).

Then, the portion of the Schottky layer 15 is removed by a usual lithography and an etching method to expose the charge supply layer 14. Hereat, AlGaN and GaN can be selectively etched, and the Schottky layer 15 can be removed in good controllability. The source electrode 17a and the drain electrode 17b which are making ohmic contact with the charge supply layer 14 are formed by depositing a titanium (Ti) film with a thickness of about 20 nm and an aluminum (Al) film with a thickness of about 200 nm on the charge supply layer 14 which was exposed, by an electron beam deposition method and the like (FIG. 8b).

Then, the gate electrode 16 which is making Schottky contact on the Schottky layer 15 is formed by depositing the laminate of a thickness of 20 nm of nickel (Ni)/a thickness of 300 nm of gold (Au) and the like and patterning on the Schottky layer 15 by a usual lithography and a lift-off method (FIG. 8*c*). HEMT is completed below according to the usual production steps of a semiconductor device.

Then, in the present Embodiment, the p-type semiconductor region 18 is formed by implanting magnesium (Mg) ion into the Schottky layer 15 between the gate electrode 16 and the drain electrode 17*b* by a usual ion implantation method and activating it by thermal treatment at 1150° C. Hereat, the Schottky layer 15 which was formed by lowering the growth temperature does not damage the insulation property even if thermal treatment is carried out for activation of p-type impurity ion and can provide the nitride semiconductor device superior in characteristics as previously illustrated. Also in the production process of the present Embodiment, since it is formed only by setting the growth temperature at a lower temperature (550° C.) than the growth temperature (1080° C.) of epitaxial layers such as the channel layer 13 and the charge supply layer 14 as a method of forming the Schottky layer 15 with the crystallinity with minute grains superior in insulation property, controllability is good. Further, since the method of forming the p-type semiconductor region 18 is also subjected to a usual ion implantation method, controllability is extremely good and the production can be carried out in good yield.

EMBODIMENT 7

Figure 9A:
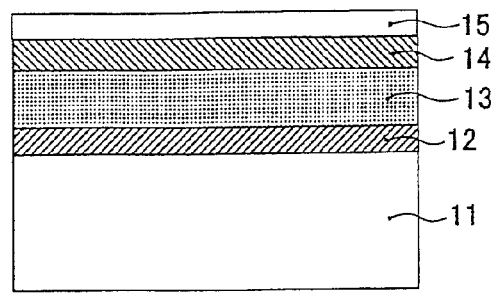
FIGS. 9(a)-9(d) are respective illustrations of the production process of the nitride semiconductor device which is the third Embodiment of the present invention.

Then, the production process of HEMT which is shown in the Embodiment 3 is illustrated. As shown in FIG. 9 in like manner as the fifth Embodiment, a buffer layer 12 consisting of aluminum nitride (AlN) with a thickness of about 100 nm is grown on a substrate 11 consisting of silicon carbide (SiC) by an MOCVD method, and then a channel layer 13 consisting of non-doped gallium nitride (GaN) with a thickness of 2 μm and a charge supply layer 14 consisting of n-type aluminum gallium nitride (AlGaN) with a thickness of 15 nm which forms the two dimensional electron gas being carriers at an interface with the channel layer 13 are grown at a substrate temperature of 1080° C. in order. Then, the substrate temperature is set at 550° C. and a Schottky layer 15 consisting of non-doped gallium nitride (GaN) with a thickness of 10 nm is grown. The Schottky layer 15 becomes the crystallinity with minute grains by being thus grown at a low substrate temperature and becomes a layer superior in insulation property (FIG. 9*a*).

Figure 9B:
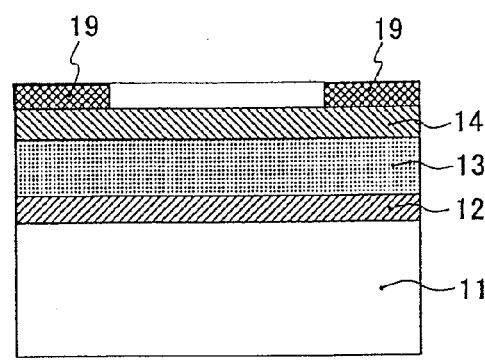
Figure 9C:
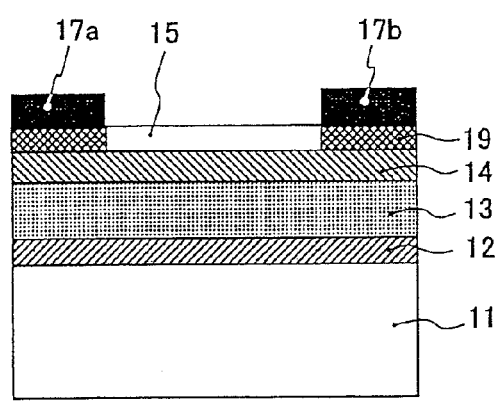

Then, silicon (Si) ion is implanted into the portion of the Schottky layer 15 by a usual ion implantation method, and it is activated by thermal treatment at 1150° C. to form the n-type semiconductor region 19 (FIG. 9*b*). The insulation property of the Schottky layer 15 is not damaged by the thermal treatment for activation of the impurity ion implanted. The source electrode 17*a* and the drain electrode 17*b* which are making ohmic contact with the charge supply layer 14 are formed by depositing a titanium (Ti) film with a thickness of about 20 nm and an aluminum (Al) film with a thickness of about 200 nm on the n-type semiconductor region 19 by an electron beam deposition method and the like (FIG. 9*c*).

Figure 9D:
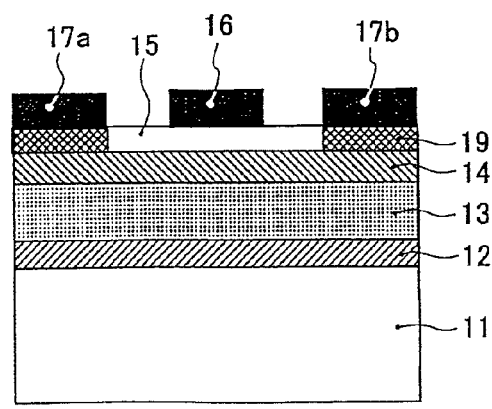
Figure 10:
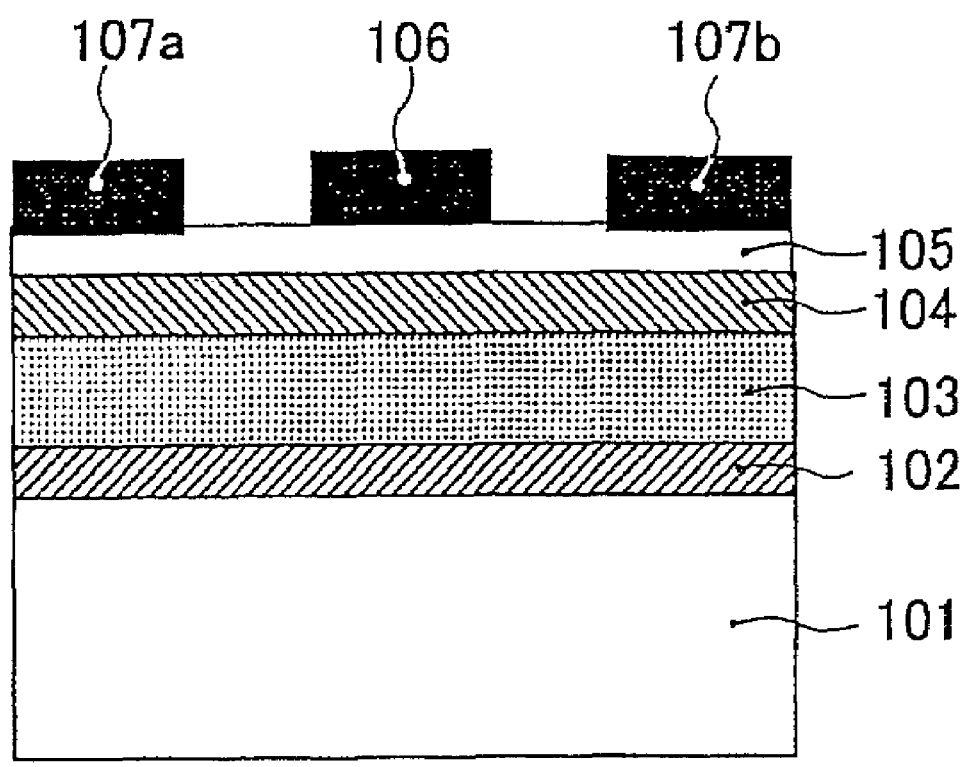
FIG. 10 is a cross-section view of this kind of conventional nitride semiconductor device.

Then, the gate electrode 16 which is making Schottky contact on the Schottky layer 15 is formed by depositing the laminate of a thickness of 20 nm of nickel (Ni)/a thickness of 300 nm of gold (Au) and the like and patterning on the Schottky layer 15 by a usual lithography and a lift-off method (FIG. 9*d*). HEMT is completed below according to the usual production steps of a semiconductor device.

Also in the production process of the present Embodiment, since it is formed only by setting the growth temperature at a lower temperature (550° C.) than the growth temperature (1080° C.) of epitaxial layers such as the channel layer 13 and the charge supply layer 14 as a method of forming the Schottky layer 15 with the crystallinity with minute grains superior in insulation property, controllability is good. Further, since the method of forming the n-type semiconductor region 19 is also subjected to a usual ion implantation method, controllability is extremely good and the production can be carried out in good yield. Further, since the source electrode 17*a* and the drain electrode 17*b* can be formed by providing the n-type semiconductor region 19 thus without removing the portion of the Schottky layer 15, it becomes a planar structure, and the yield of the production steps and reliability are improved.

EMBODIMENT 8

Then, the production process of HEMT which is shown in Embodiment 4 is illustrated. As shown in FIG. 9 in like manner as the seventh Embodiment, a buffer layer 12 consisting of aluminum nitride (AlN) with a thickness of about 100 nm is grown on a substrate 11 consisting of silicon carbide (SiC) by an MOCVD method, and then a channel layer 13 consisting of non-doped gallium nitride (GaN) with a thickness of 2 μm and a charge supply layer 14 consisting of n-type aluminum gallium nitride (AlGaN) with a thickness of 15 nm which forms the two dimensional electron gas being carriers at an interface with the channel layer 13 are grown at a substrate temperature of 1080° C. in order. Then, the substrate temperature is set at 550° C. and a Schottky layer 15 consisting of non-doped gallium nitride (GaN) with a thickness of 10 nm is grown. The Schottky layer 15 becomes the crystallinity with minute grains by being thus grown at a low substrate temperature and becomes a layer superior in insulation property (FIG. 9*a*).

Then, silicon (Si) ion is implanted into the portion of the Schottky layer 15 by a usual ion implantation method, and it is activated by thermal treatment at 1150° C. to form the n-type semiconductor region 19 (FIG. 9*b*). The insulation property of the Schottky layer 15 is not damaged by the thermal treatment for activation of the impurity ion implanted. The source electrode 17*a* and the drain electrode 17*b* which are making ohmic contact with the charge supply layer 14 are formed by depositing a titanium (Ti) film with a thickness of about 20 nm and an aluminum (Al) film with a thickness of about 200 nm on the n-type semiconductor region 19 by an electron beam deposition method and the like (FIG. 9*c*).

Then, in the present Embodiment, the p-type semiconductor region 18 is formed by implanting magnesium (Mg) ion between the gate electrode 16 and the drain electrode 17*b* by a usual ion implantation method and activating it by thermal treatment at 1150° C. The insulation property of the Schottky layer 15 is not damaged by the thermal treatment for activation of the impurity ion implanted and the nitride semiconductor device superior in characteristics as previously illustrated can be provided. Also in the production process of the present Embodiment, since it is formed only by setting the growth temperature at a lower temperature (550° C.) than the growth temperature (1080° C.) of epitaxial layers such as the channel layer 13 and the charge supply layer 14 as a method of forming the Schottky layer 15 with the crystallinity with minute grains superior in insulation property, controllability is good. Further, since the method of forming the p-type semiconductor region 18 and the n-type semiconductor region 19 is also subjected to a usual ion implantation method, controllability is extremely good and the production can be carried out in good yield. Further, since the source electrode 17a and the drain electrode 17b can be formed on the n-type semiconductor region 19 thus without removing the portion of the Schottky layer 15, it becomes a planar structure, and the yield of the production steps and reliability are improved.

The Embodiments of the present invention were illustrated above, but the present invention is not limited to these Embodiments, and can be variously changed. For example, the nitride semiconductor layer in which the impurity was added was made as an active layer (channel layer) in place of the nitride semiconductor with the HEMT structure, and it can be made as an FET structure in which the above-mentioned Schottky layer 15 was formed on the active layer. Further, the nitride semiconductor layer is not limited to the GaN/AlGaN system, and the second nitride semiconductor layer (it is corresponding to the Schottky layer 15 in the above-mentioned Embodiment) on which the control electrode is formed includes GaN, InN or a mixed crystal compound thereof and can be composed by a layer which does not contain aluminum. Further, the first nitride semiconductor layer (it is corresponding to the charge supply layer 14 in the above-mentioned Embodiment) includes GaN, InN, AlN or a mixed crystal semiconductor thereof and can be composed by a layer which contains aluminum. A sapphire substrate may be used in place of the silicon carbide (SiC) substrate which was used in Embodiments. In such a case, it is preferable to use gallium nitride (GaN) as the buffer layer 12. Further, a silicon (Si) substrate may be used in place of the silicon carbide (SiC) substrate.

Further, the compositions of the control electrode making the Schottky contact with the second nitride semiconductor layer and the electrode is making ohmic contact with the first nitride semiconductor layer or the second nitride semiconductor layer may be appropriately selected in accordance with the kinds of the nitride semiconductor layers used.

Further, the second nitride semiconductor layer was illustrated as the crystallinity with minute grains, but this is the aggregate of minute crystal grains or a structure which rearranged them. The size of crystal grains, arrangement and the like are varied according to the growth temperature, the composition of atmosphere gas at growth, the kind of a substrate on which growth is carried out, and the like, and obtained by controlling the growth temperature within a range of obtaining a desired insulation property (gate leakage current which can be permissible). When the growth temperature of the second nitride semiconductor layer is set at a lower temperature by about 400° C. or more than the growth temperature of the first nitride semiconductor layer, it is preferable for forming the control electrode of HEMT or FET.

I claim:

1. A method for producing a nitride semiconductor device, which comprises a III-V Group nitride semiconductor layer being composed of a III Group element consisting of at least one of a group containing of gallium, aluminum, boron and indium and V Group element consisting of at least nitrogen among a group consisting of nitrogen, phosphorus and arsenic, comprising steps of:
    forming a first nitride semiconductor device comprising said III-V Group nitride semiconductor layer on a substrate;
    forming a second nitride semiconductor device comprising said III-V Group nitride semiconductor device and crystallinity with minute grains not containing aluminum at a lower temperature than a film forming temperature on said first nitride semiconductor layer; and
    forming a control electrode on said second nitride semiconductor layer.

2. A method for producing a nitride semiconductor device according to claim 1, comprising steps of:
    forming a third nitride semiconductor layer, which comprises said III-V Group nitride semiconductor layer having a smaller energy band gap than that of said first nitride semiconductor layer, on said substrate; and
    forming said first nitride semiconductor layer on said third nitride semiconductor layer.

3. A method for producing a nitride semiconductor device according to claim 1, comprising steps of:
    removing said second nitride semiconductor layer;
    forming an n-type nitride semiconductor region on said first nitride semiconductor layer being exposed or a part of said second nitride semiconductor layer;
    forming a source electrode or drain electrode making ohmic contact with said first nitride semiconductor layer on said n-type nitride semiconductor region; and
    forming said control electrode making Schottky contact with said second nitride semiconductor layer.

4. A method for producing a nitride semiconductor device according to claim 1, comprising steps of:
    forming said control electrode on said second nitride semiconductor layer being deposited on said first nitride semiconductor layer comprising non-doped or n-type nitride semiconductor layer; and
    forming a p-type nitride semiconductor region at said second nitride semiconductor layer located between said control electrode and said drain electrode.

5. A method for producing a nitride semiconductor device of claim 4, wherein an annealing process for steps of forming said n-type nitride semiconductor region or forming said p-type nitride semiconductor region is carried out within a temperature range at which the sheet resistance of said second nitride semiconductor layer is not lowered.

6. A method for producing a nitride semiconductor device, which comprises a III-V Group nitride semiconductor layer being composed of a III Group element consisting of at least one of a group containing of gallium, aluminum, boron and indium and V Group element consisting of at least nitrogen among a group consisting of nitrogen, phosphorus and arsenic, comprising steps of:
    forming a first nitride semiconductor device comprising said III-V Group nitride semiconductor layer, and containing aluminum on a substrate;
    forming a second nitride semiconductor device comprising said III-V Group nitride semiconductor device and crystallinity with minute grains not containing aluminum at a lower temperature than a film forming temperature on said first nitride semiconductor layer; and
    forming a control electrode on said second nitride semiconductor layer.

7. A method for producing a nitride semiconductor device according to claim 6 comprising steps of:
    forming a third nitride semiconductor layer, which comprises said III-V Group nitride semiconductor layer having a smaller energy band gap than that of said first nitride semiconductor layer, on said substrate; and
    forming said first nitride semiconductor layer on said third nitride semiconductor layer.

8. A method for producing a nitride semiconductor device according to claim 6 comprising steps of:
    removing said second nitride semiconductor layer;

forming an n-type nitride semiconductor region on said first nitride semiconductor layer being exposed or a part of said second nitride semiconductor layer;

forming a source electrode or drain electrode making ohmic contact with said first nitride semiconductor layer on said n-type nitride semiconductor region; and forming said control electrode making Schottky contact with said second nitride semiconductor layer.

9. A method for producing a nitride semiconductor device according to claim 6 comprising steps of:

forming said control electrode on said second nitride semiconductor layer being deposited on said first nitride semiconductor layer comprising non-doped or n-type nitride semiconductor layer; and forming a p-type nitride semiconductor region at said second nitride semiconductor layer located between said control electrode and said drain electrode.

10. A method for producing a nitride semiconductor device of claim 9, wherein an annealing process for steps of forming said n-type nitride semiconductor region or forming said p-type nitride semiconductor region is carried out within a temperature range at which the sheet resistance of said second nitride semiconductor layer is not lowered.

* * * * *